United States Patent
Kopola et al.

(10) Patent No.: US 6,586,268 B1
(45) Date of Patent: Jul. 1, 2003

(54) OPTOELECTRONIC COMPONENT AND MANUFACTURING METHOD

(75) Inventors: Harri Kopola, Oulu (FI); Juha Rantala, Kiiminki (FI); Jouko Vähäkangas, Oulu (FI); Pentti Karioja, Oulu (FI)

(73) Assignee: Valtion Teknillinen Tutkimuskeskus, Vtt (FI)

( * ) Notice: Subject to any disclaimer, the term of this patent is extended or adjusted under 35 U.S.C. 154(b) by 0 days.

(21) Appl. No.: 09/762,635

(22) PCT Filed: Aug. 10, 1999

(86) PCT No.: PCT/FI99/00663
§ 371 (c)(1),
(2), (4) Date: Feb. 12, 2001

(87) PCT Pub. No.: WO00/10206
PCT Pub. Date: Feb. 24, 2000

(30) Foreign Application Priority Data

Aug. 11, 1998 (FI) .................................................. 981731

(51) Int. Cl.⁷ ............................................. H01L 21/00
(52) U.S. Cl. ......................................................... 438/22
(58) Field of Search .............................. 438/23, 25, 29, 438/30, 99, 82, 22

(56) References Cited

U.S. PATENT DOCUMENTS

| | | | |
|---|---|---|---|
| 5,130,397 A | | 7/1992 | Zeigler ........................... 528/9 |
| 5,608,287 A | * | 3/1997 | Hung et al. .................. 313/503 |
| 5,714,838 A | * | 2/1998 | Haight et al. ................ 313/506 |
| 6,005,692 A | * | 12/1999 | Stahl ........................... 359/15 |
| 6,208,074 B1 | * | 3/2001 | Ilegems et al. ............. 313/504 |

FOREIGN PATENT DOCUMENTS

| | | |
|---|---|---|
| EP | 0 741 303 A2 | 11/1996 |
| JP | 9-279135 | 10/1997 |
| WO | WO 98/26315 | 6/1998 |

OTHER PUBLICATIONS

Angela B. Seddon, "Sol–gel derived organic–inorganic hybrid materials for photonic applications", Sol–Gel Materials for Device Applications (Ref. No. 1998/412), IEE Colloquium on May 13, 1998, pp. 6/1–6/6.
Popall et al., "ORMOCERs/sup TM/ –new photo–patternable dielectric and optical materials for MCM–packaging", Electronic Components & Technology Conference, 48th IEEE, May 1998, pp. 1018–1025.
Li et al., "Sol–gel integrated optical coupler by ultraviolet light imprinting", Electronics Letters, Feb. 1995, vol. 31, No. 4, pp. 455–456.
Rantala J.T. et al., "Sol–gel hybrid glass diffractive elements by direct electron–beam exposure", Electronics Letters, Mar. 1998, vol. 34, No. 5, pp. 455–456.
Geerts et al., "New organic light emitting materials", Chemical Abstracts 1997:162307, Book of Abstracts, 213th ACS National Meeting, San Francisco, Apr. 13–17, 1997.
Rantala et al., "Organic Light Emitting Mciro–Pixels on Hybrid Sol–Gel Glass Arrays", Proceedings of Finnish Optics Days, p. 42, 1998, ISBN 951–42–4944–5.
Andrews M.P. et al., "Sol–Gel and Polymer Photonic Devices", SPIE, vol. CR68, 1997, pp. 253–285.

* cited by examiner

*Primary Examiner*—David Nelms
*Assistant Examiner*—Quoc Hoang
(74) *Attorney, Agent, or Firm*—Young & Thompson

(57) ABSTRACT

An optoelectronic component and a method of manufacturing such a component. The component includes at least one pixel comprising a first and a second electrode for electric coupling. An optoelectronically active material is between the electrodes. The optoelectronically active material is a hybrid sol-gel glass that is chemically supplemented with a material affecting the optoelectronic properties. The component is manufactured by spreading the optoelectronically active hybrid sol-gel on the first electrode, hardening the hybrid sol-gel glass by radiation, and forming the second electrode on the optoelectronically active hybrid sol-gel glass.

9 Claims, 6 Drawing Sheets

OPTOELECTRONIC COMPONENT AND MANUFACTURING METHOD

FIELD OF THE INVENTION

The invention relates to a component interacting with electromagnetic radiation, and a method of manufacturing such a component. The arrangement according to the invention relates particularly to organic semiconductor devices emitting and detecting optical radiation.

BACKGROUND OF THE INVENTION

Light Emitting Diode (LED) structures consisting of organic, light-emitting micro-pixels and utilizing a sol-gel glass material can be used to manufacture light, effective devices and components which operate at a low voltage and employ different optical wavelengths. Organic electroluminescent components are typically based on the laminated structure of semiconductor films, situated between two electrodes. As it is well known, such films can be manufactured of various semiconducting organic materials, which can be made to emit electromagnetic radiation. Semiconducting organic materials which can be used in the manufacture of Organic Light-Emitting Devices (OLED) include polymers and molecules where the structure of molecular orbitals enables excitation of electrons to a higher excited state, which is thereafter discharged in the form of electromagnetic radiation.

Semiconducting organic materials include several compounds containing aromatic groups, and complexes thereof with inorganic ions, for example tris-(8-hydroxyquinolinato) aluminum (Alq3), tris-(8-hydroxyquinolinato)europium (Euq3), tris-(8-hydroxyquinolinato)gallium (Gaq3), N,N'-diphenyl-N,N'-bis-(3-methylphenyl)-1,1'-biphenyl-4,4'-diamine (TPD), 5,6,11,12-tetraphenylene-naphthacene (rubrene), 1,2,3,4,5-pentaphenyl-1,3-cyclopentadiene (PPCP), 2-(biphenyl)-5-(4-t-butylphenyl)-1,3,4-oxadiazole (PBD), tris(p-totyl)amone (TTA), and the like.

Polymers that are suitable in the manufacture of OLEDs include poly(phenylenevinylene) (PPV) and derivatives thereof, such as poly[2-methoxy-5-(2-ethylhexyloxy)-1,4-phenylenevinylene (MEH-PPV), poly(3-alkylthiophene) (P3AT), polyvinylcarbazole (PVK), poly (cyanphthalylidene) (PCP), poly[p-phenylene-2,6-benzobis (oxazole)] (PBO), poly[(1-dodecyloxy-4-methyl-1,3-phenylene-(2,5"-terthienylene)] (mPTTh), polyacetylene (PA), polyaniline (PANI), polythiophene (PT), polypyrrole (Ppy), and the like.

Generally used optoelectronically active semiconductor molecules are TPD and $Alq_3$, and the junction between the molecules operates as a LED based on electroluminescence. A prior art pixel LED is prepared by first forming, from a sol-gel glass, positions for the pixels for example on an electrode situated on a glass substrate, such as indium tin oxide (ITO), in such a way that the electrode is covered with the sol-gel glass in a gas or liquid phase. The sol-gel glass is thereafter stabilized and/or hardened into its final form so that the glass covers the entire electrode except for the pixels. In empty recesses provided at the pixels and surrounded by the sol-gel glass, the recesses having typically a depth of micrometers, are formed junctions of semiconducting materials, such as a junction between TPD and Alq3. A second electrode is thereafter grown, typically in a gas phase, over the entire surface or at least at the pixels comprising a semiconductor junction, the electrode being also supported with a substrate, if required. Such a component is set forth, for example, in *Organic light emitting micro-pixels on hybrid sol-gel glass arrays*, by Rantala et al (Proceedings of Finnish Optics Days, p 42, 1998, ISBN 951-42-4944-5), which is incorporated herein by reference. When a controlling bias voltage is applied to the electrodes, electrons are injected from the first electrode, which preferably has a low work function, and holes are injected from the second electrode, which preferably has a high work function. When the electrons and the holes recombine, the organic semiconductor used as the luminescent material is transferred to an excited state, which emits electromagnetic radiation when it is discharged. The LED thus emits at a wavelength determined by the used organic semiconducting materials, such as TPD and $Alq_3$ molecules, the wavelength usually being in the optical band of electromagnetic radiation, i.e. ultraviolet—visible light—infrared.

A problem with the prior art arrangement is the weak stability of the components, which results from, for example, weak adhesion of the electrode materials. Another problem is the complicated manufacturing process.

BRIEF DESCRIPTION OF THE INVENTION

A purpose of the invention is to provide a component and a manufacturing method avoiding the problems mentioned above. This is achieved with an optoelectronic component comprising at least one pixel comprising a first and a second electrode for electric coupling, and between the electrodes an optoelectronically active material. In the component according to the invention, the optoelectronically active material is a hybrid sol-gel to which is chemically attached a material affecting the optoelectronic properties and a radiation sensitive polymer material, and the optoelectronically active material is hardened and patterned using at least one of the following: UV radiation, X-rays, electron radiation and chemical treatment.

The problems can also be solved with a method of manufacturing an optoelectronic component, the method utilizing at least a first and a second electrode and between them an optoelectronically active material. The manufacturing method according to the invention comprises preparing the optoelectronically active material by chemically supplementing the sol-gel with a material affecting the optoelectronic properties and a radiation sensitive polymer material, the sol-gel being thus changed to hybrid sol-gel; spreading the optoelectronically active hybrid sol-gel on the first electrode; hardening the hybrid sol-gel by using at least one of the following: UV radiation, X-rays, electron radiation and chemical treatment; forming the second electrode on the optoelectronically active hybrid sol-gel.

The component and the manufacturing method according to the invention provide several advantages. The process is simple since it is based only on a known manufacturing technique that is economical and easy to control. For example, oxides are always formed on the surface of metals and they constitute a strong bond in the sol-gel material. Therefore the component is stable and durable.

BRIEF DESCRIPTION OF THE DRAWINGS

The invention will be described below in more detail in connection with preferred embodiments, with reference to the accompanying drawings, in which.

DETAILED DESCRIPTION OF THE INVENTION

Figure 1A:
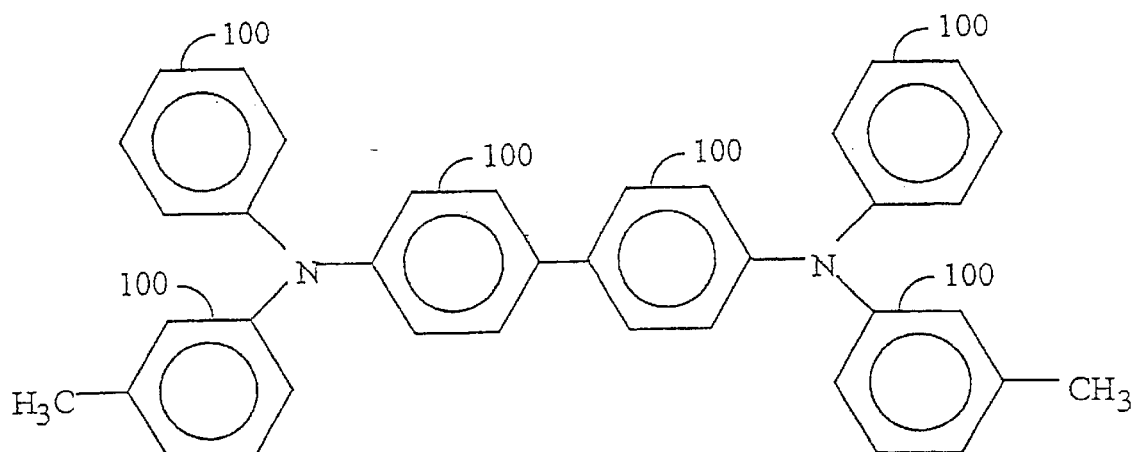
FIG. 1A shows the chemical structure of an optoelectronically active TPD material.

The arrangement according to the invention is particularly suitable for LEDs and diode-type detectors based on organic materials, without being restricted thereto, however. An emitting component according to the invention can be applied in different displays (also transparent displays), which are utilized, for example, in clocks, televisions, mobile phones, cameras, and in quality control in industry.

Let us examine in greater detail a sol-gel material on which the arrangement according to the invention is based. The sol-gel material comprises an inorganic network obtained by preparing a colloidal suspension (sol), which is gelatinized to form a continuous liquid phase (gel). Useful starting materials in the synthesis of such colloids include metals or metalloid elements surrounded by different reactive ligands. Metal alkoxides are widely used since they react easily with water. Most commonly used metal alkoxides include alkoxy silanes, such as tetramethoxy silane (TMOS) and tetraethoxy silane (TEOS). Other alkoxides, such as aluminates, titanates, borates, germanium alkoxides and zirconium alkoxides, and different combinations thereof, can also be used. Silicon dioxide is an advantageous carrier material in the invention.

In the present invention, a light-sensitive hybrid sol-gel material which can be subjected to photolithography is prepared by hydrolysis and condensation of the selected metal alkoxide or metalloid element or a mixture thereof and an unsaturated organic polymer in accordance with a conventional sol-gel method. This is described in *Passive and Active Sol-Gel Materials and Devices* by Andrews, M. P. et al. in SPIE vol. CR68, SOL-Gel and Polymer Photonic Devices, Najafi. S. I., and Andrews, M. P. (eds.), pp. 253–285 (1997), which is incorporated herein by reference.

The organic polymer can be replaced with some other suitable material that can be cross-linked by means of light, such as methacryloxypropyl trimethoxysilane. To the obtained hybrid material are attached organic semiconducting materials by means of chemical bonds, such as hydrogen bonds, or by van der Waals forces, covalent bonds or suitable bonding molecules or atoms, such as nitrogen atoms. Bonding organic semiconducting materials to a hybrid material enables considerably greater recombination since electrons and holes are not linked only at the junction of the materials but in the entire hybrid matrix. This results particularly in higher quantum efficiency and also a longer service life for the apparatus, since sufficient luminosity is obtained with lower current density.

On the other hand, the surrounding hybrid material protects the sensitive organic semiconducting materials from humidity and oxidation. When the optoactive semiconducting materials are linked to a chemically inorganic material frame, the material will be very stable against recrystallization. Furthermore, hybrid materials are known to prevent diffusion very effectively in different substances, particularly metals. The hybrid sol-gel frame thus prevents diffusion.

The hybrid sol-gel technique used in the invention has another considerable advantage over the conventional organic LEDs, i.e. the process is fully compatible with conventional lithographic processes. Therefore it is also suitable for mass production and enables the production of micro LED pixels. Micro-pixelation, in turn, enables the isolation of individual light-emitting areas, wherefore the production of matrix structures becomes easy. Matrix structures can thereafter be used to manufacture high-resolution displays that replace the currently used combinations of a liquid crystal display and display illumination.

The wavelength of the light to be emitted can be adjusted through selection of the materials used in the matrix pixels, and colour matrix displays are thus possible. The matrix structure also makes the apparatus more reliable since each individual pixel in the matrix operates as a separate unit. Therefore, a coalescent chain reaction which typically occurs when organic LEDs become faulty does not take place in the entire structure of the apparatus but is limited to an individual micro-pixel, whereas the other parts of the matrix remain unimpaired. In such a reaction disintegrating active molecules may form radicals destroying active molecules such that the disintegration propagates like a chain reaction in the material. The damage caused by the destruction of a single micro-pixel is calculated only in micrometers and cannot be detected with the naked eye. The same applies to the detector structure.

Since the hybrid material can be doped, i.e. various desired molecules can be added thereto, it is also possible to supplement the matrix with organic semiconductor molecules emitting at different wavelengths in order to obtain a combination that emits light of exactly a desired colour, including white light. The passive hybrid material surrounding a pixel resembles glass and is therefore transparent. The light emitted from a pixel is able to also propagate in the passive area, which causes light diffusion, wherefore a separate diffuser is not needed to provide backlight. Correspondingly, the passive area can also be made non-transparent or sufficiently wide so that no crosstalk occurs between the pixels and no light diffusion effect can be detected.

The process of manufacturing micro-pixels is based on a conventional photolithographic process where a hybrid material doped with organic semiconductors is grown at a low temperature (0 to 200° C.) on a semiconducting electrode material or, correspondingly, on a metal electrode. A desired pattern is etched on the hybrid material by means of UV light and a contact mask, whereafter one of the electrode materials is added as one electrode. The other, transparent electrode can consist of ITO or a hybrid sol-gel material.

Due to the diffusion prevention properties and high tolerance of chemical, thermal and mechanical stress of the hybrid material, an electrode grown on the sol-gel material can be patterned by photolithographic, chemical and/or dry etching techniques or the like. It is thus possible to form wirings with which an individual pixel can be controlled as a separate unit, thus producing an active display structure. In order to decrease the wire density, the opposite electrode can also be patterned before the luminescent material is grown.

The optoelectronically active materials of organic diodes are examined below by way of example with reference to FIGS. 1A to 1C. FIG. 1A shows TPD, which comprises six benzene rings 100. The pairs of benzene rings situated at the ends of the chain are attached to the chain by a nitrogen bond (N). The reactive part of the TPD molecule consists of $CH_3$ groups.

Figure 1B:
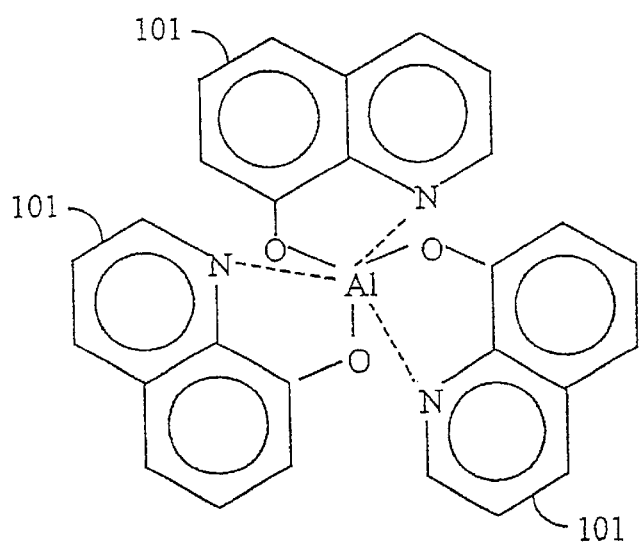
FIG. 1B shows the chemical structure of an optoelectronically active $Alq_3$ material.

FIG. 1B shows $Alq_3$, which comprises three quinoline molecules 101 attached to the aluminium (Al) by nitrogen and oxygen bonds (N, O). $Alq_3$ operates as an electron carrier in an OLED component.

Figure 1C:
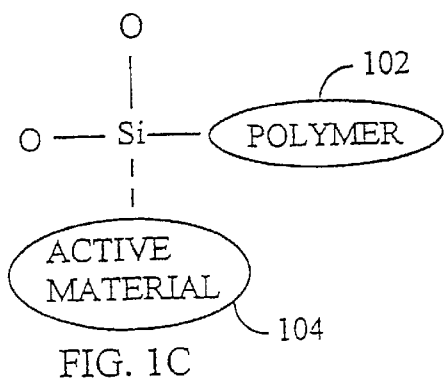
FIG. 1C shows a hybrid sol-gel material as an example.

FIG. 1C shows a hybrid sol-gel material comprising an inorganic and an organic component. The inorganic carrier material is, for example, silicon (Si) in a dioxide form, and the organic material is a polymer 102 and/or the aforementioned semiconducting organic material 104, which replaces two of the four oxygen bonds in the silicon dioxide. The sol-gel material thus comprises a carrier material (for example silicon dioxide) and an optoelectronically active molecule 104. The hybrid sol-gel material also comprises a polymer 102 which facilitates hardening and patterning. Other carrier materials besides silicon include aluminium, germanium and titanium. The organic semiconducting materials, which are optoelectronically active materials, are connected to the hybrid material by chemical bonds, such as hydrogen bonds, by van der Waals forces or covalent bonds or by means of suitable bonding molecules.

An organic molecule structure, such as $Alq_3$, provides the optical operation of the diode. The polymer, in turn, gelatinizes the hybrid sol-gel so that it can be spread more evenly on the electrode. In the invention useful polymers include the aforementioned polymers that can be excited. Other useful polymers include polymers of acrylic acid and methacrylic acid, and the like.

The spreading is carried out in a manner known per se by spinning, spraying or dipping, for example. Preferably, the polymer used is sensitive to ultraviolet light, the hybrid sol-gel can be patterned and hardened by UV light. The sol-gel and the hybrid sol-gel can also be patterned and hardened by X-rays or electron rays. Further, the hardened sol-gel glass can also be patterned by etching or mechanical machining.

Figure 2A:
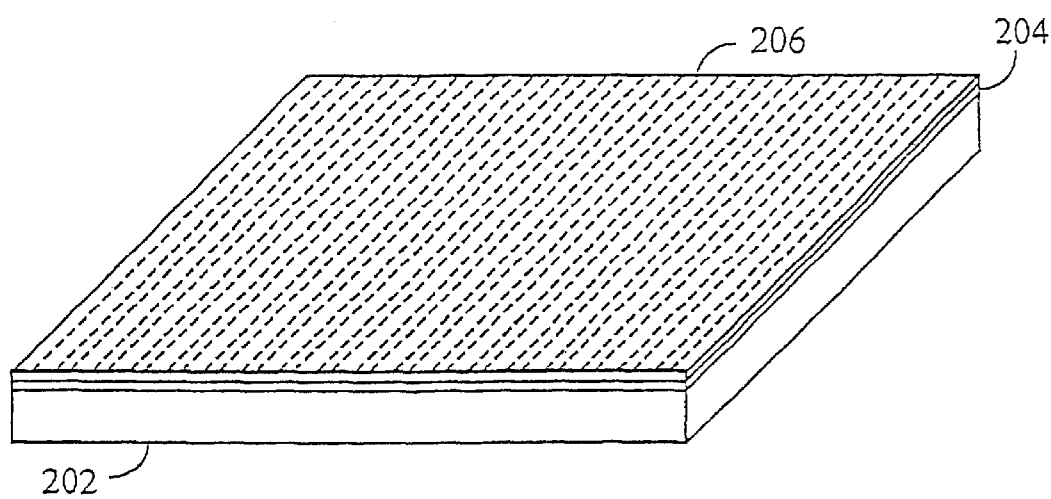
FIG. 2A shows prior art manufacture of a matrix consisting of organic LEDs.
Figure 2B:
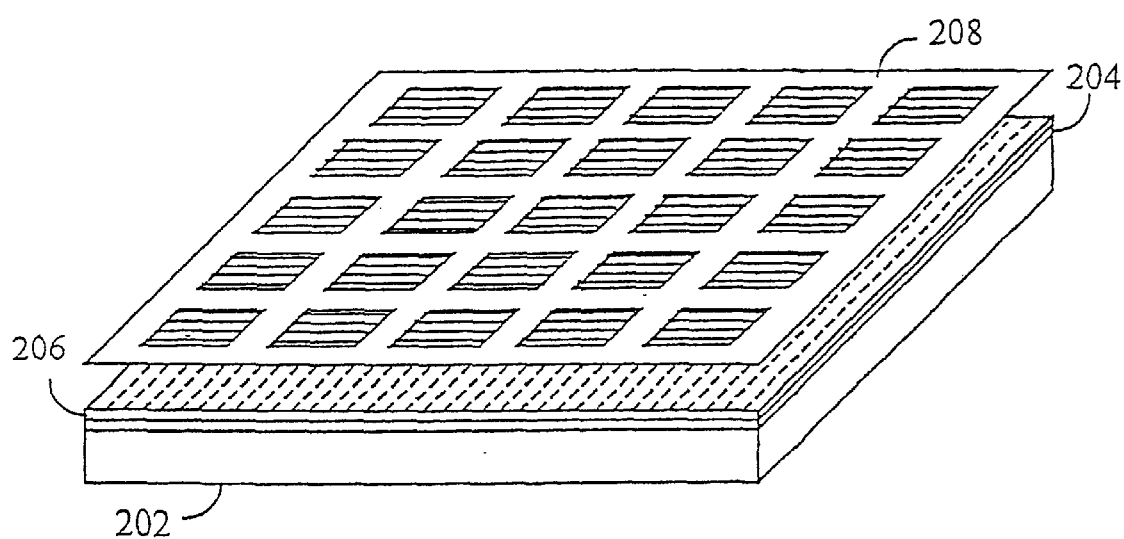
FIG. 2B shows prior art manufacture of a matrix consisting of organic LEDs.
Figure 2C:
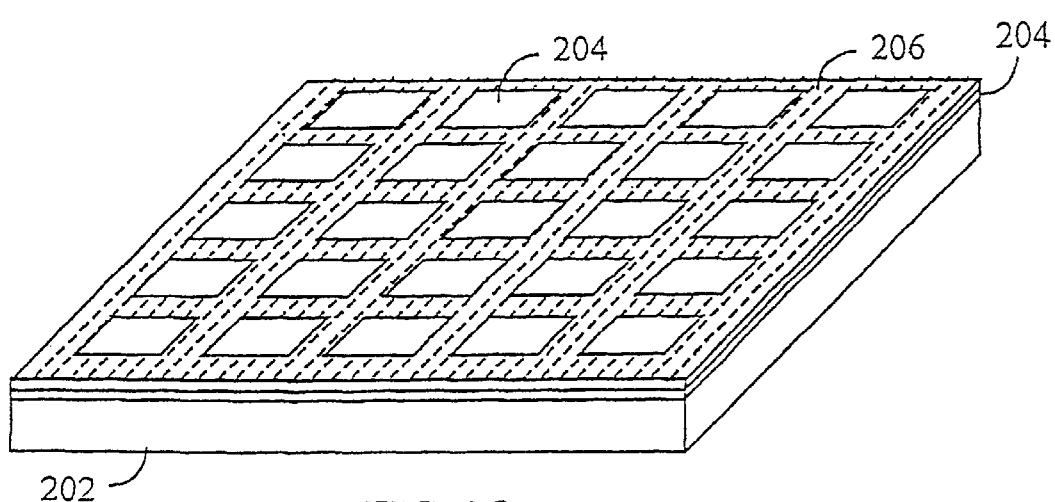
FIG. 2C shows prior art manufacture of a matrix consisting of organic LEDs.

FIGS. 2A to 2C show the manufacture of a prior art OLED matrix. FIG. 2A shows a substrate 202, an electrode 204 and an optoelectronically inactive sol-gel film 206. The sol-gel material 206 is spread on the electrode 204 as a thin film. The optoelectronically inactive sol-gel material lacks an optoelectronically active molecule 104. The electrode 204 can be, for example, an ITO film, which is transparent on a wide optical wavelength range. The ITO electrode can be replaced with other prior art electrically conductive transparent electrode materials, such as polyaniline. The substrate 202 is, for example, glass. Alternatively, other suitable substrate materials, such as various plastics and ceramic materials, can be used. In FIG. 2B, the sol-gel film 206 is covered by a photomask 208 in order to pattern and harden the sol-gel film in a desired manner, usually by means of UV radiation. After exposure to light the unexposed parts of the sol-gel film 206 can be removed easily, whereas the exposed parts adhere to the electrode 204 as a glassy layer. In FIG. 2C, the sol-gel film 206 is provided with patterning corresponding to the mask 208, and the electrode is covered by the sol-gel glass everywhere except at the pixels. The prior art arrangement thus utilizes an optoelectronically inactive sol-gel material to surround the OLED components. However, the prior art does not teach the use of sol-gel material in the manufacture of optoelectronic components themselves, i.e. in this case the matrix pixels.

Figure 3A:
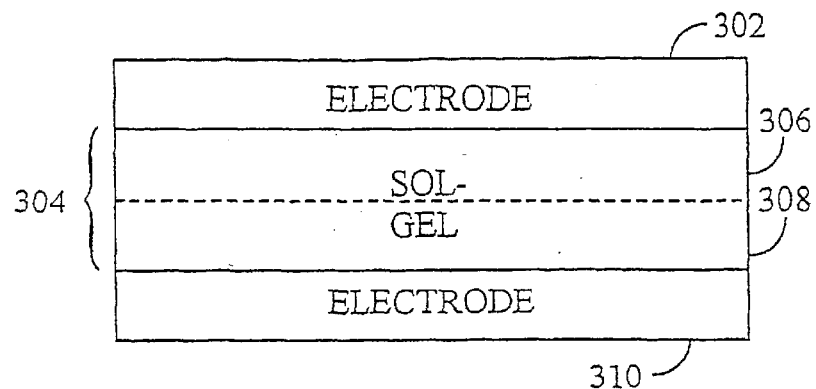
FIG. 3A shows the structure of an organic diode.

FIG. 3A shows generally the structure of an optoelectronic component, such as an OLED, according to the invention. An arrangement according to the invention to be used as a detector has a similar structure. FIG. 3 shows one component or one pixel of an array or matrix structure, comprising a first electrode 302, a layer of optoelectronically active sol-gel material 304 and a second electrode 310. The optoelectronically active sol-gel layer comprises two parts. In the first part 306, for example organic $Alq_3$ molecules are chemically added to the sol-gel material, and in the second part 308 for example TPD molecules are chemically added to the sol-gel material.

However, it is also possible that only one optoelectronically active organic molecule is added to the sol-gel material 304. In order to ensure diode-type optoelectronic operation, it is important in such a case that the first layer 306 is doped into a p-type layer (containing an excess of holes) and the second layer 308 is doped into an n-type layer (an excess of electrons). When an electric field required for the operation is coupled to the electrodes 302 and 310 by means of a power supply, the optoelectronic operation begins. When the component is a LED, it emits optical radiation on a wavelength determined by a colour molecule. When the component is a diode detector, the amount of current that passes through the component varies according to the optical radiation applied on the component, i.e. the component detects the radiation it receives. A component operating as a detector is particularly sensitive to the range of optical radiation determined by the colour molecule. Both PIN diode and avalanche diode implementations are possible. The size of a component (or a pixel) is restricted by the manufacturing technique. For example, in a photolithographic process the wavelength of UV radiation determines the smallest possible size. The component operates preferably in the area of optical radiation where the wavelength varies between 40 nm and 1 mm, but the actual operating range is determined by the semiconducting materials used. Therefore the optoelectronic operating range mentioned in the present application can also consist of a considerably broader band of electromagnetic radiation.

Figure 3B:
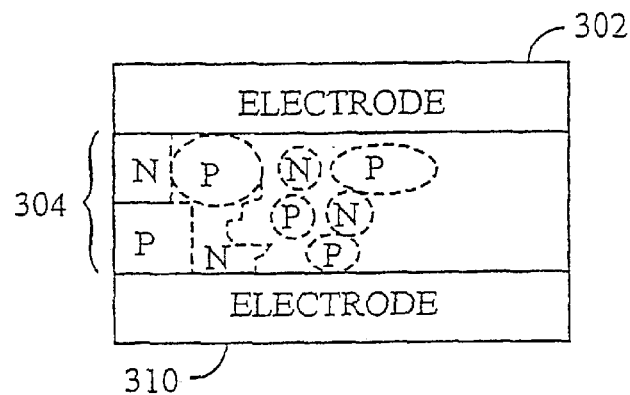
FIG. 3B shows doped areas of an organic diode.

FIG. 3B shows the formation of p-type and n-type junctions in a semiconductor device implemented with the sol-gel material. Particularly a detector may comprise an undoped layer between the p-type and n-type junctions. The forms of the doped regions can vary to a great extent. The smallest doped p-type or n-type region consists of only one molecule.

Figure 4:
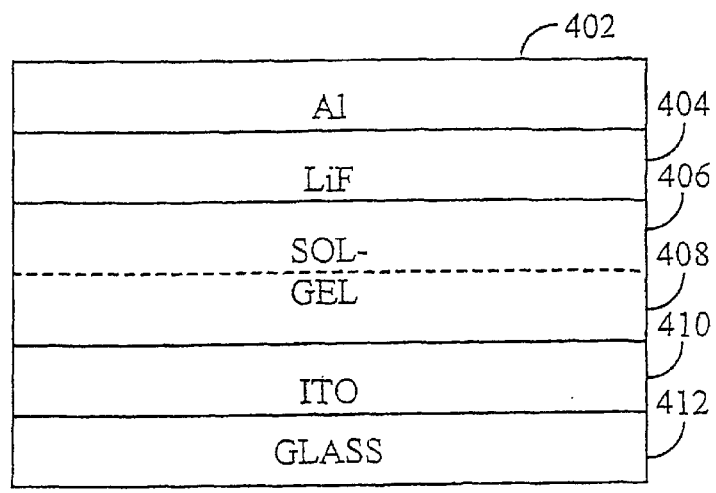
FIG. 4 shows the structure of an organic diode in greater detail.

FIG. 4 shows a more detailed structure of a component according to the invention. The component comprises a first electrode 402, an intensifying layer 404, an Alq₃ sol-gel layer 406, a TPD sol-gel layer 408, a second electrode 410 and a substrate 412. The function of the intensifying layer 404, which consists of for example lithium fluoride, is to increase the quantum efficiency and to improve the luminance of the LED operation. The TPD layer 408 or the like can be formed as a uniform layer on the substrate on which the light-emitting materials are produced. In this example the first electrode 402 is a thin aluminum sheet, which also supports the structure of a single component or pixel. Support is also provided by a glass plate operating as the substrate 412.

Figure 5A:
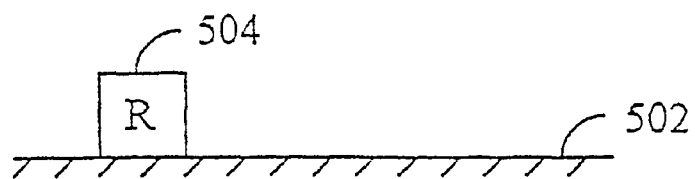
FIG. 5A shows the manufacture of a multi-pixel diode matrix.
Figure 5B:
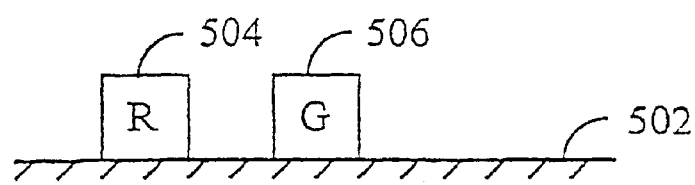
FIG. 5B shows the manufacture of a multi-pixel diode matrix.
Figure 5C:
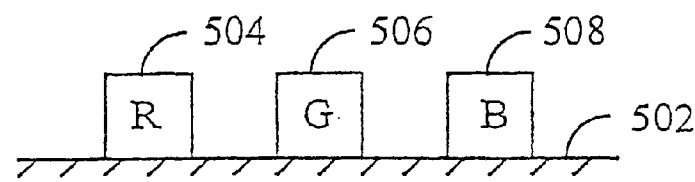
FIG. 5C shows the manufacture of a multi-pixel diode matrix.
Figure 5D:
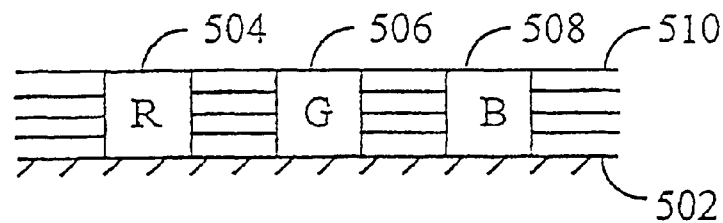
FIG. 5D shows the manufacture of a multi-pixel diode matrix.

FIGS. 5A to 5D show the manufacture of a multi-pixel component. In this example, pixels operating on three different wavelengths are used. In FIG. 5A, one or several pixels 504 operating for example by red light are formed on an electrode 502, such as a supporting metal electrode or an electrically conductive film placed on a strong substrate, from optoelectronically active sol-gel material in a manner known per se, such as by a lithographic process. Since the component according to the invention is fully compatible with the lithographic process, the advantage is that the component is highly suitable for mass production. Pixels operating on other wavelengths can be formed thereafter in a corresponding manner. In FIG. 5B, one or several pixels 506 operating by green light, for example, are formed on the electrode 502. In FIG. 5C, one or several pixels 508 operating, for example, by blue light are formed on the electrode 502. When the pixels have been formed, they are surrounded from the sides by an optoelectronically inactive sol-gel material 510 as seen in FIG. 5D, whereafter electrodes are formed on the pixels to control the optoelectronic operation of the pixels. However, it is not essential for the component according to the invention in which order the required films are made, but the order can be selected freely. The pixels 504, 506 and 508 can be hardened and patterned for example by UV radiation, X-rays or electron radiation. The electrodes can be formed in a manner known per se for example by means of a liquid phase, a gas phase (evaporation, sputtering), a contact pressure, a conductive paint or printing of electrodes. When the pixels are light-emitting micro LEDs, it is possible to form a flat display of a colour television, for example. Correspondingly, when the pixels operate as detectors, such a matrix can be a part of a colour television camera, for example.

Figure 6A:
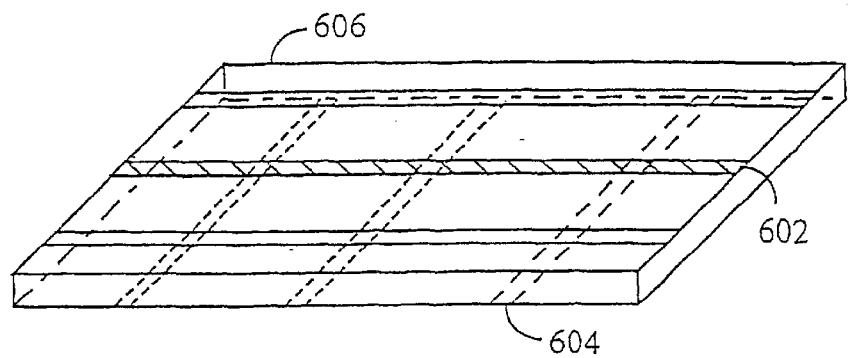
FIG. 6A shows a matrix pixelated by means of electrodes.

FIG. 6A shows control of an OLED pixels matrix. In FIG. 6A the optoelectronically active sol-gel film 606 is situated between two netlike electrode structures. In this arrangement the sol-gel film does not necessarily have to be pixelated, but it can be an even, undivided film. When an electric control power is coupled to electrodes 602 and 604, the sol-gel point in the junction of the electrodes 602 and 604 is optically activated. If the component in question is a LED, the sol-gel point emits optical radiation. On the other hand, if it is a diode detector, the sol-gel point is a diode detecting optical radiation.

Figure 6B:
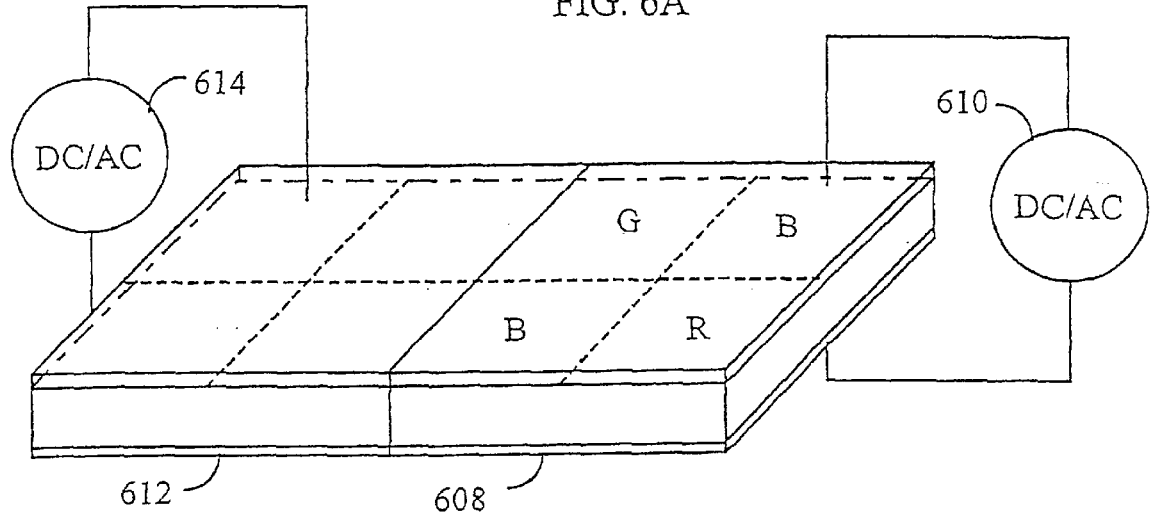
FIG. 6B shows control of a pixel group.

FIG. 6B shows an OLED pixel matrix where the pixel groups share a source of electric control power. In this example the pixel matrix comprises groups 608 and 612 with four pixels. The pixels in the group are, for example, a blue pixel B, a red pixel R and a green pixel G. Each pixel group is activated by a separate power supply 610 and 614, which supplies a direct voltage or an alternating voltage varying typically between a few volts and dozens of volts. When the pixel group 608 has been activated, it emits or receives either blue, red or green light, depending on the operation.

Figure 7:
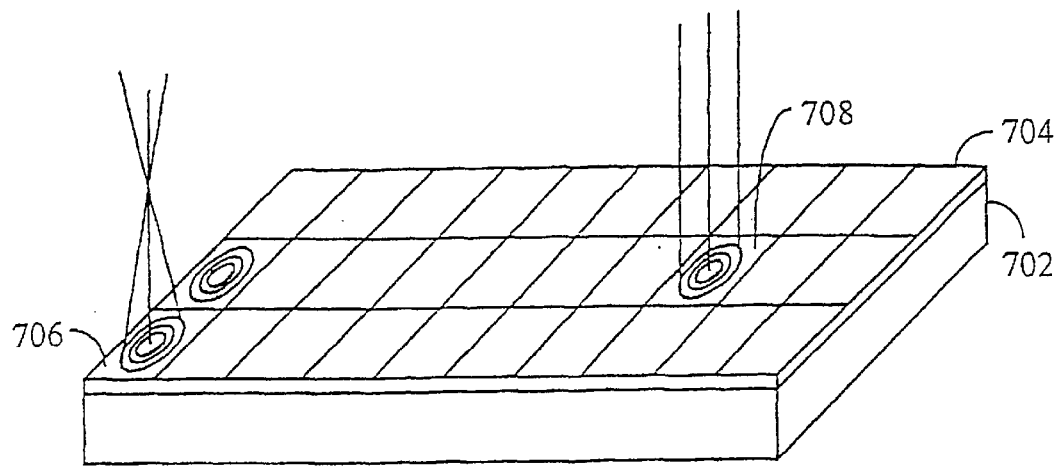
FIG. 7 shows a LED matrix where each pixel is covered by a lens.

FIG. 7 shows an arrangement according to the invention where the radiation from a pixel or a pixel group 702 is directed by an optical component 704, which is preferably integrated into a pixel or a matrix. A pixel diode which emits radiation without the control of optical components is a Lambertian emitter, which is not desirable in all applications (for example in a cash machine the angle of view of the display should usually be narrow). For example, optical radiation transmitted by a pixel 706 is focused preferably with a lens. The lens can be, for example, a binary lens, a multi-level diffractive lens or a refractive lens. Optical radiation transmitted by a pixel 708 is, in turn, collimated with a lens. Lenses and other optical components also affect the operation of pixels used as detectors.

Figure 8:
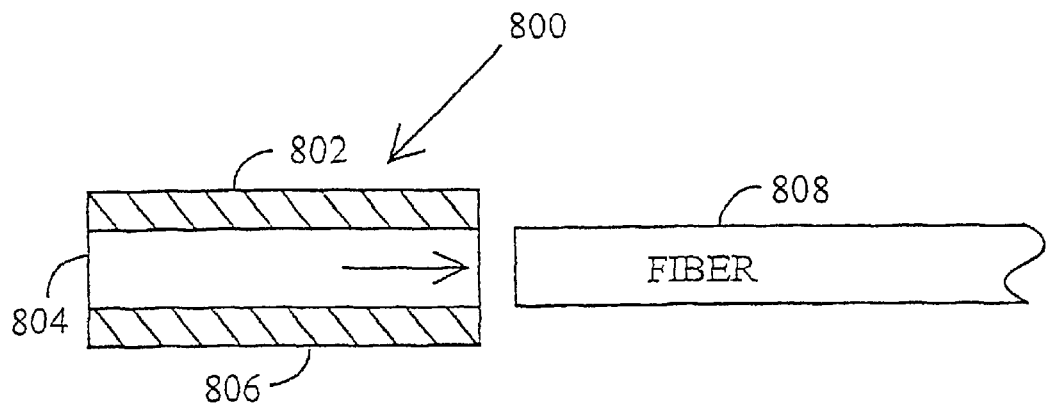
FIG. 8 shows a LED from which optical radiation is connected to an optical fibre.

FIG. 8 shows a situation where an optoelectronic component 800 is connected to an optical fibre 808. This is achieved for example such that optical radiation produced by a sol-gel LED structure 804 of the optoelectronic component 800 is transmitted from the end of the optoelectronic component 800 comprising no electrodes 802 and 806 to the optical fibre 808.

Figure 9:
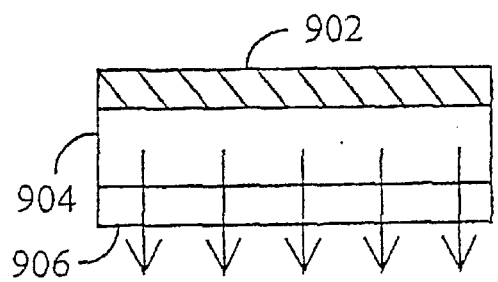
FIG. 9 shows a LED where one electrode is non-transparent.

FIG. 9 shows an OLED according to the invention comprising electrodes 902 and 906 and a sol-gel LED structure 904. The upper electrode 902 is, for example, a non-transparent metal electrode supporting the structure of the OLED component, and the lower electrode 906 is a transparent ITO electrode, which is preferably situated on a transparent glass or plastic sheet (not shown in the figure). Thus, the radiation produced by the LED 904 is directed primarily through the lower electrode 906.

Figure 10:
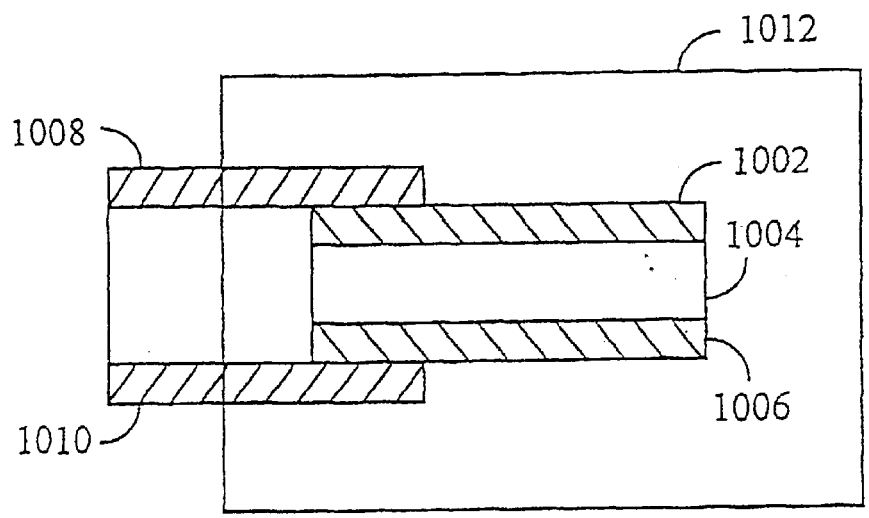
FIG. 10 shows protection of a LED by encapsulation.

FIG. 10 shows a packaging arrangement for a component according to the invention. The structure comprises a first electrode 1002, an optoelectronically active layer 1004, a second electrode 1006, a first contact wire 1008, a second contact wire 1010 and an optoelectronically inactive capsule 1012, which can be made of sol-gel glass, plastic or optical epoxy, for example. The capsule 1012 protects the electrodes 1002 and 1006 and the sol-gel diode structure almost hermetically. Array and matrix structures according to the inventive arrangement can also be packed similarly.

Even though the invention is described above with reference to the example according to the accompanying drawings, it is clear that the invention is not restricted thereto but it can be modified in several ways within the scope of the inventive idea disclosed in the appended claims.

What is claimed is:

1. A method of manufacturing an optoelectronically component, the method comprising:
   utilizing at least first and second electrodes having an optoelectronically active material therebetween;
   preparing an optoelectronically active hybrid sol-gel material by chemically bonding an inorganic carrier, a semiconductive organic material affecting optoelectronic properties of the optoelectronic component and a polymer material;
   spreading the optoelectronically active hybrid sol-gel on the first electrode;
   hardening the hybrid sol-gel by using at least one of the following: UV radiation, X-rays, electron radiation and chemical treatment, the polymer material in the hybrid sol-gel being sensitive to the hardening process; and
   forming the second electrode on the optoelectronically active hybrid sol-gel.

2. A manufacturing method according to claim 1, further comprising the step of forming pixels in the optoelectronic component by patterning the hybrid sol-gel.

3. A manufacturing method according to claim 2, wherein all the surfaces of the pixels in the component, except for the electrode contact areas, are protected with optoelectronically inactive sol-gel by spreading and hardening the so-gel on the first electrode and around the pixels.

4. A manufacturing method according to claim 2, wherein when several pixels operating on different wavelengths are being formed, the optoelectronically active hybrid sol-gel is spread and hardened several times, and optoelectronically active hybrid sol-gel materials operating on different wavelengths are used at different rounds of spreading and hardening.

5. A manufacturing method according to claim 1, further comprising the step of spreading the hybrid sol-gel on the electrode as a thin film by one of spinning, spraying or dipping.

6. A manufacturing method according to claim 1, wherein the second electrode is formed by means of one of a liquid phase, a gas phase, a contact weight, a conductive paint or printing of electrodes.

7. A manufacturing method according to claim 1, further comprising the step of connecting the optical operation of the optoelectronic component to an optical fibre.

8. A manufacturing method according to claim 1, further comprising the step of connecting the optical operation of the optoelectronic component to an optical component.

9. A manufacturing method according to claim 1, further comprising the step of protecting the component through encapsulation with an optoelectronically inactive sol-gel material.

* * * * *